US007973591B2

(12) United States Patent
Kim

(10) Patent No.: US 7,973,591 B2
(45) Date of Patent: Jul. 5, 2011

(54) INTERNAL VOLTAGE GENERATION CIRCUIT WITH CONTROLLED ENABLE PULSE WIDTH

(75) Inventor: Myung Jin Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 70 days.

(21) Appl. No.: 12/198,938

(22) Filed: Aug. 27, 2008

(65) Prior Publication Data

US 2009/0066310 A1 Mar. 12, 2009

(30) Foreign Application Priority Data

Sep. 11, 2007 (KR) ........................ 10-2007-0092316

(51) Int. Cl.
*G11C 5/14* (2006.01)

(52) U.S. Cl. ........................................ 327/530; 327/534

(58) Field of Classification Search .................. 327/530, 327/534–543

See application file for complete search history.

(56) References Cited

U.S. PATENT DOCUMENTS 5,943,263 A * 8/1999 Roohparvar ............ 365/185.18

FOREIGN PATENT DOCUMENTS

KR 1020040007906 A 1/2004
KR 2004-0076789 A 9/2004
KR 0757933 B1 9/2007

* cited by examiner

*Primary Examiner* — Lincoln Donovan
*Assistant Examiner* — Diana J Cheng
(74) *Attorney, Agent, or Firm* — Ladas & Parry LLP

(57) ABSTRACT

The internal voltage generation circuit includes an internal voltage enable signal generation unit generating an internal voltage enable signal whose enable pulse width is controlled according to an external voltage. An internal voltage generation unit generates an internal voltage corresponding to a reference voltage according to the internal voltage enable signal. The internal voltage generation circuit generates an internal voltage according to an internal voltage enable signal whose enable pulse width is controlled in response to an external voltage, and thus current consumption is improved, and the internal voltage generation circuit provides a stable internal voltage.

23 Claims, 10 Drawing Sheets

INTERNAL VOLTAGE GENERATION CIRCUIT WITH CONTROLLED ENABLE PULSE WIDTH

CROSS-REFERENCE TO RELATED APPLICATIONS

The present application claims priority to Korean patent application number 10-2007-0092316 filed on Sep. 11, 2007, which is incorporated herein by reference in its entirety.

BACKGROUND OF THE INVENTION

The present invention relates to a semiconductor circuit, and more particularly to an internal voltage generation circuit which generates an internal voltage corresponding to a reference voltage.

A conventional semiconductor circuit has an internal voltage generation circuit that generates an internal voltage by converting an external voltage in order to improve operation stability. The internal circuit is operated with the generated internal voltage.

Referring to FIG. 1, a conventional internal voltage generation circuit includes a voltage detection unit 10, a driver unit 12, and a voltage distribution unit 14.

In the operation of the internal voltage generation circuit 1, the voltage detection unit 10 compares the reference voltage VREFC with the distribution voltage VDIV to output a control voltage VOUT. The driver unit 12 receives the control voltage VOUT and pumps and outputs the core voltage VCORE. The voltage distribution unit 14 receives the core voltage VCORE and outputs the distribution voltage VDIV.

In other words, when the bank enable signal EN_BANK is enabled, the internal voltage generation circuit 1 compares the reference voltage VREFC with the distribution voltage VDIV, and performs a pumping operation according to the result of the comparison in order to generate a core voltage VCORE at a predetermined level.

Herein, the bank enable signal EN_BANK, which is a signal output from a command decoder (not shown), is continuously enabled while a precharge command is performed, which occurs after an active command is performed.

Meanwhile, a semiconductor circuit should secure operation stability for an external voltage VDD within a predetermined range (for example, within 1.8V to 1.2V when the operation voltage is 1.5V).

However, the conventional internal voltage generation circuit 1 is controlled by a bank enable signal EN_BANK with an enable pulse that has a fixed width regardless of the external voltage VDD. Therefore, a problem occurs in that it is difficult to output the internal voltage in a stable manner at a high voltage HIGH _VDD (1.8V) and a low voltage LOW_VDD (1.2V).

In other words, when the internal voltage generation circuit 1 is driven at high voltage HIGH_VDD (1.8V), current drivability is increased excessively in order to overdrive the internal voltage while the bank enable signal EN_BANK is enabled. The excessive increase in current drivability causes a problem in that current consumption is increased.

When the internal voltage generation circuit 1 is driven at low voltage LOW_VDD (1.2V), a problem occurs, in that the predetermined level of internal voltage cannot be restored while the bank enable signal EN_BANK is enabled.

In particular, under circumstances where the semiconductor circuit is used as a main component for various portable products, and is operated at gradually reduced operation voltage, a problem occurs in that as the threshold voltage Vt characteristic of the transistor is deteriorated, resulting in the deterioration of the current drivability of the internal voltage generation circuit 1.

SUMMARY OF THE INVENTION

The present invention provides an internal voltage generation circuit which controls the enable pulse width of an internal voltage enable signal that corresponds to an external voltage in order to generate an internal voltage, thereby improving current consumption and providing a stable internal voltage.

The internal voltage generation circuit includes an internal voltage enable signal generation unit which generating an internal voltage enable signal whose enable pulse width is controlled according to an external voltage; and an internal voltage generation unit generating an internal voltage corresponding to a reference voltage according to the internal voltage enable signal.

The internal voltage enable signal generation unit includes an external voltage detection unit supplying a detection voltage that varies according to the external voltage; a pulse control unit variably delaying a pulse width of a bank enable signal according to a level of the detection voltage; and an enable signal generation unit generating the internal voltage enable signal synchronized with the bank enable signal and having a pulse width controlled by a signal output from the pulse control unit.

The external voltage detection unit supplies a common node voltage among resistors connected in series between a power supply terminal supplying the external voltage and a power supply terminal supplying ground voltage to the detection voltage.

The internal voltage enable signal generation unit receives the bank enable signals to sequentially delay and output them, due to a serial connection of an odd number of pulse control units.

The pulse control unit includes a driver being driven by the bank enable signal; and a controller controlling a driving speed of the driver by the detection voltage.

The driver includes a PMOS transistor and an NMOS transistor being connected in series between the power supply terminal supplying the external voltage and the controller, and inverting the bank enable signals supplied to their common gate and outputting them to their common drain.

The controller includes an NMOS transistor whose drain is connected to the driver. The NMOS transistors driving is controlled by the detection voltage applied to the gate thereof. A resistor is connected between a source of the NMOS transistor and the power supply terminal supplying the ground voltage.

The pulse control unit further includes a delay device delaying an output of the driver.

The delay device includes a PMOS transistor whose source and drain are connected to the power supply terminal supplying the external voltage and whose gate is connected to an output terminal of the driver; and an NMOS transistor whose source and drain are connected to the power supply terminal supplying the ground voltage and whose gate is connected to the output terminal of the driver.

The enable signal generation unit includes an NAND gate receiving the bank enable signal and a signal output from the pulse control unit; and an inverter inversely driving an output of the NAND gate and outputting it as the internal voltage enable signal.

There is provided another embodiment of an internal voltage generation circuit comprising: a control signal generation unit controlling a pulse width of a bank enable signal according to an external voltage to generate a control signal; an internal voltage enable signal generation unit generating the internal voltage enable signal synchronized with the bank enable signal and having a pulse width controlled by the control signal; and an internal voltage generation unit generating an internal voltage corresponding to a reference voltage according to the internal voltage enable signal.

The control signal generation unit includes an external voltage detection unit supplying detection voltage varying according to the external voltage; a pulse control unit varying a pulse width of the bank enable signal according to a level of the detection voltage; and a control signal output unit outputting the control signal synchronized with the bank enable signal and whose pulse width is controlled by a signal output from the pulse control unit.

The external voltage detection unit supplies common node voltage among resistors connected in series between a power supply terminal supplying the external voltage and a power supply terminal supplying ground voltage to the detection voltage.

The control voltage generation unit receives the bank enable signals to sequentially delay and output them, due to a serial connection of an odd number of pulse control units.

The pulse control unit includes a driver being driven by the bank enable signal; and a controller controlling a driving speed of the driver by the detection voltage.

The driver includes a PMOS transistor and an NMOS transistor connected in series between the power supply terminal supplying the external voltage and the controller, and inversely driving the bank enable signals supplied to their common gate and outputting them to their common drain.

The controller includes an NMOS transistor whose drain is connected to the driver, and driving is controlled by the detection voltage applied to a gate thereof; and a resistor being connected between a source of the NMOS transistor and the power supply terminal supplying the ground voltage.

The pulse control unit further includes a delay device delaying an output of the driver.

The delay device includes a PMOS transistor whose source and drain are connected to the power supply terminal supplying the external voltage and gate is connected to an output terminal of the driver; and an NMOS transistor whose source and drain are connected to the power supply terminal supplying the ground voltage and gate is connected to the output terminal of the driver.

The control signal output unit includes an NAND gate receiving the bank enable signal and a signal output from the pulse control unit; and an inverter inverting an output of the NAND gate and outputting it as the control signal.

The internal voltage enable signal generation unit includes: a delay unit delaying the control signal; an enable signal generation unit generating the internal voltage enable signal by combining the bank enable signal and a signal output from the delay unit.

The delay unit delays the control signal to be shorter than the enable pulse width of the bank enable signal to output it.

The enable signal generation unit includes a NOR gate receiving the bank enable signal and a signal output from the delay unit; and inverters driving an output of the NOR gate to output it as the internal voltage enable signal.

The present invention provides an internal voltage generation circuit which generates internal voltage by an internal voltage enable signal whose enable pulse width is controlled according to external voltage, thereby having effects that current consumption is improved and stable internal voltage is provided.

DESCRIPTION OF SPECIFIC EMBODIMENTS

The present invention provides an internal voltage generation circuit which provides an internal voltage enable signal having a pulse width that is controlled to correspond to an external voltage in order to perform a stable operation within an operation voltage range, thereby generating an internal voltage.

Figure 2:
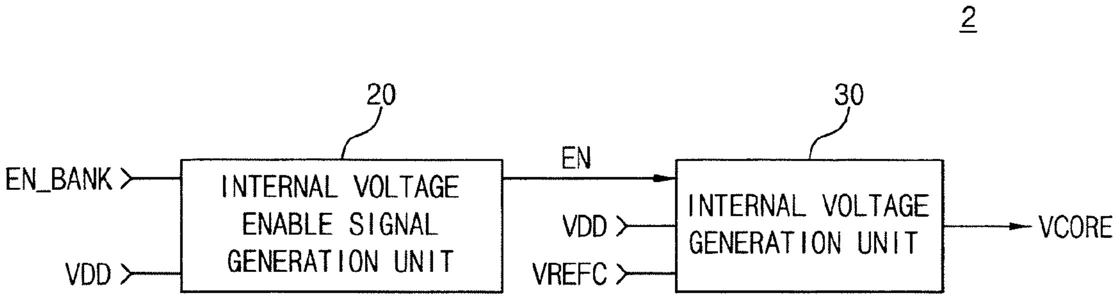
FIG. 2 is a block diagram of an internal voltage generation circuit according to a first embodiment of the present invention.

FIG. 2 is a block diagram of an internal voltage generation circuit according to an embodiment of the present invention. Referring to FIG. 2, in order to improve current consumption, especially that which is required in a low power product, an internal voltage generation circuit 2 according to an embodiment of the present invention includes an internal voltage enable signal generation unit 20 that generates an internal voltage enable signal EN by reducing the enable pulse width of a bank enable signal EN_BANK corresponding to an external voltage VDD; and an internal voltage generation unit 30 that generates an internal voltage corresponding to a reference voltage VREFC in response to the internal voltage enable signal EN.

In other words, the internal voltage enable signal generation unit 20 generates an internal voltage enable signal EN whose enable pulse width at a high voltage HIGH_VDD is shorter than its enable pulse width at a low voltage LOW_VDD.

Herein, the high voltage HIGH_VDD and the low voltage LOW_VDD are voltage levels at which a semiconductor circuit should perform a normal operation. For example, when the operation voltage of the semiconductor circuit is 1.5V, it should perform a normal operation between 1.8V and 1.2V. The higher level (1.8V)of the normal operation voltage range is the high voltage HIGH_VDD, and the lower level (1.2V)of the normal operation voltage range is the low voltage LOW_VDD.

Figure 3:
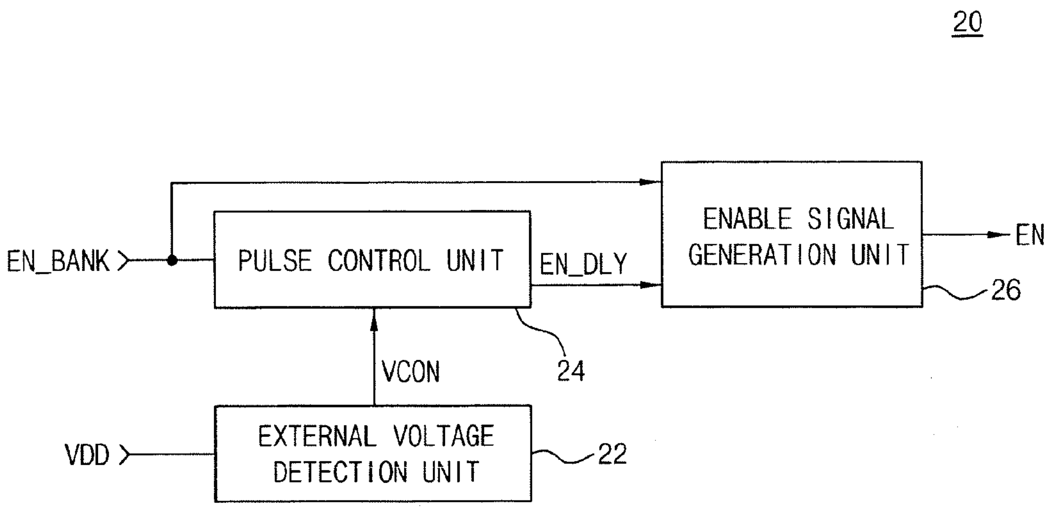
FIG. 3 is a block diagram of the internal voltage enable signal generation unit of FIG. 2.

FIG. 3 is a block diagram of the internal voltage enable signal generation unit of FIG. 2. Referring to FIG. 3, an internal voltage enable signal generation unit 20 includes an external voltage detection unit 22, a pulse control unit 24, and an enable signal generation unit 26.

The external voltage detection unit 22 supplies a variable detection voltage that corresponds to the external voltage VDD. The pulse control unit 24 varies a delay in the pulse width of a bank enable signal EN_BANK in accordance with the level of the detection voltage VCON. The enable signal generation unit 26 outputs an internal voltage enable signal EN in response to a combination of the bank enable signal EN_BANK and a signal EN_DLY that is output from the pulse control unit 24.

Figure 4:
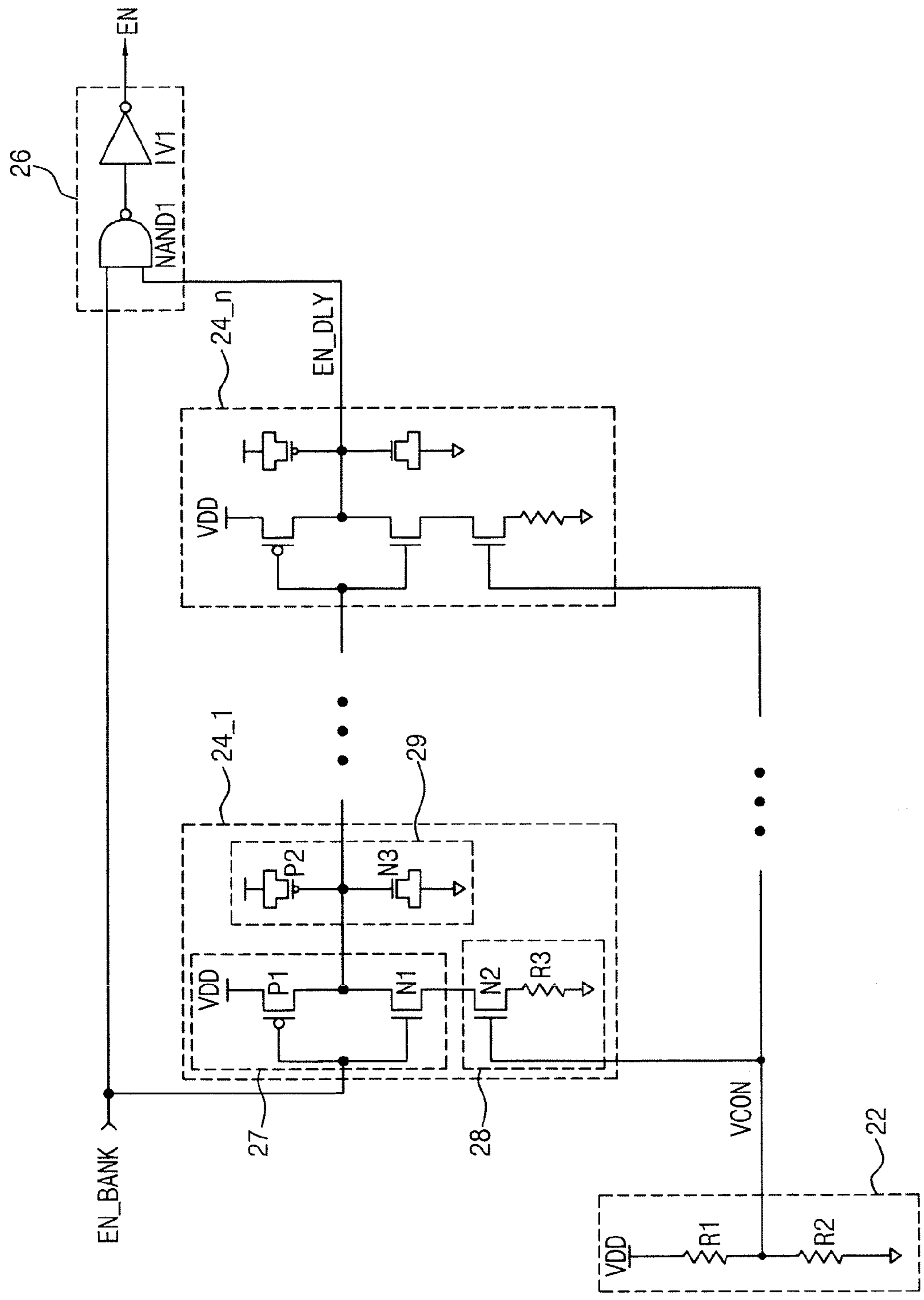
FIG. 4 is a detailed circuit view of the internal voltage enable signal generation unit of FIG. 3.

FIG. 4 is a detailed circuit view of the internal voltage enable signal generation unit of FIG. 3. Referring to FIG. 4, the external voltage detection unit 22 includes resistors R1, R2 connected in series between a power supply terminal that supplies the external voltage VDD and a power supply terminal that supplies a ground voltage VSS. The external voltage detection unit 22 outputs the voltage distributed by the resistors R1, R2 as the detection voltage VCON.

Herein, the detection voltage VCON varies in accordance with the external voltage VDD. In other words, when the external voltage VDD is a high voltage HIGH_VDD, the level of the voltage distributed by the resistors R1, R2 becomes high such that the detection voltage VCON is high. When the external voltage VDD is a low voltage LOW_VDD, the detection voltage VCON becomes low.

The pulse control unit 24 includes a driver 27 which drives the bank enable signal EN_BANK, a controller 28 that controls the pull-down speed of the driver 27 according to the detection voltage VCON, and a delay unit 29 that delays the output of the driver 27.

More specifically, the driver 27 includes a PMOS transistor P1 and an NMOS transistor N1 connected in series between a power supply terminal supplying the external voltage VDD and the controller 28. The driver 27 inversely drives the bank enable signal EN_BANK applied to gates thereof.

The controller 28 includes an NMOS transistor N2 whose drain is connected to the driver 27, the detection voltage VCON is applied to the gate of the NMOS transistor N2, such that the controller 28 is controlled by the detection voltage VCON. Also, the controller 28 includes a resistor R3 connected between a source of the NMOS transistor N2 and the power supply terminal supplying the ground voltage VSS.

Herein, the NMOS transistor N2 operates as a variable resistor according to the detection voltage VCON. In other words, when the detection voltage VCON is high, the turn on intensity of the NMOS transistor N2 becomes large and the NMOS transistor N2 is operates with a small resistance. When the detection voltage VCON is low, the turn on intensity of the NMOS transistor N2 becomes small and the NMOS transistor N2 operates with a large resistance.

The delay unit 29 includes a PMOS transistor P2 whose source and drain are connected to the power supply terminal supplying the external voltage VDD, and whose gate is connected to an output terminal of the driver. The delay unit also includes an NMOS transistor N3 whose source and drain are connected to the power supply terminal supplying the ground voltage VSS, and whose gate is connected to the output terminal of the driver 27.

Herein, the PMOS transistor P2 and the NMOS transistor N3 operate as a cap delaying an output of the driver 27.

Preferably, the internal voltage enable signal generation unit 20 includes an odd number of pulse control units 24 connected in series to sequentially delay the bank enable signal EN_BANK. The output of the pulse control unit 24 is the signal EN_DLY The enable signal generation unit 26 includes a NAND gate NAND1 that receives both the bank enable signal EN_BANK and a signal EN_DLY output from the pulse control unit. The enable signal generation unit also includes an inverter IV1 that inverts an output of the NAND gate NAND1 and outputs an internal voltage enable signal EN.

Figure 5A:
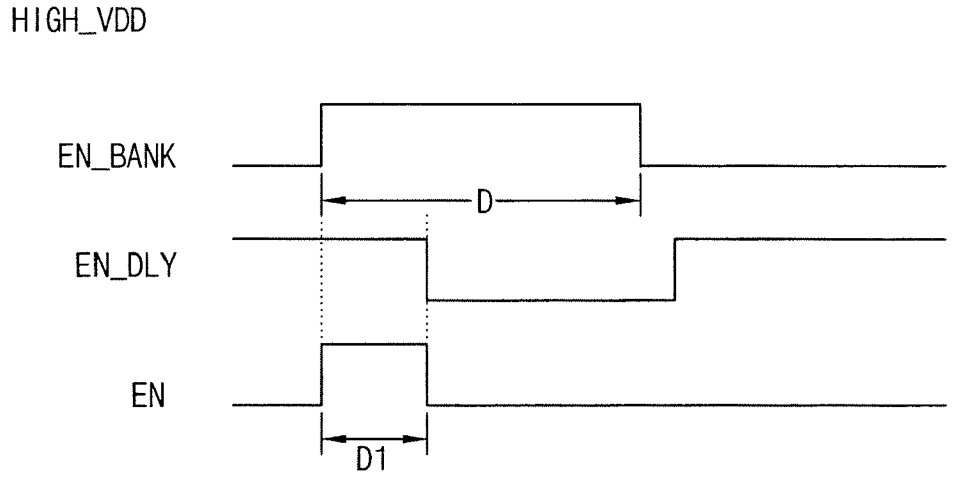
FIGS. 5A and 5B are waveform views of an internal voltage enable signal generated in the internal voltage generation circuit according to a first embodiment of the present invention.
Figure 5B:
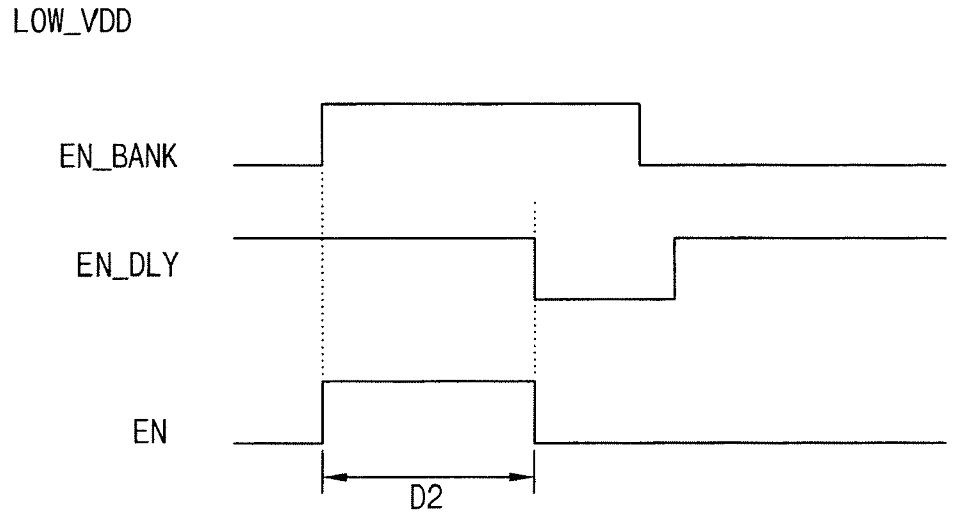

FIGS. 5A and 5B are waveform views of an internal voltage enable signal generated in an internal voltage generation circuit according to the embodiment described above. Referring to FIG. 5A, the operation of an internal voltage enable signal generation unit 20 will now be reviewed. When the external voltage VDD is a high voltage HIGH_VDD, the external voltage detection unit 22 outputs a high detection voltage VCON. The pulse control unit 24 provides a short delay D1 to the pulse width D of the bank enable signal EN_BANK to output the bank enable signal as the delay signal EN_DLY. That is, in the pulse control unit 24, the NMOS transistor N2 is operated at a low resistance when it receives the high detection voltage VCON in order to make the operation speed of the driver 27 fast. The enable signal generation unit 26 outputs an internal voltage enable signal EN having an enable pulse width corresponding to the delay D1.

Referring to FIG. 5B, the operation of the internal voltage enable signal generation unit 20 when the external voltage VDD is a low voltage LOW_VDD will now be reviewed. The external voltage detection unit 22 outputs a low detection voltage VCON, and a pulse control unit 24 provides a lengthy delay D2 to the pulse width D of a bank enable signal EN_BANK to output the bank enable signal EN_BANK as the delay signal EN_DLY. That is, the NMOS transistor N2 is operated at a high resistance when it receives the low detection voltage VCON to make the operation speed of the driver 27 slow. The enable signal generation unit 26 outputs an internal voltage enable signal EN having an enable pulse width corresponding to the delay D2.

In other words, the internal voltage enable signal generation unit 20 outputs an internal voltage enable signal EN with a shorter pulse width than the enable pulse width D of the bank enable signal EN_BANK, and also, the enable pulse width D1 at the high voltage HIGH_VDD is shorter than the enable pulse width D2 at the low voltage LOW_VDD.

Figure 6:
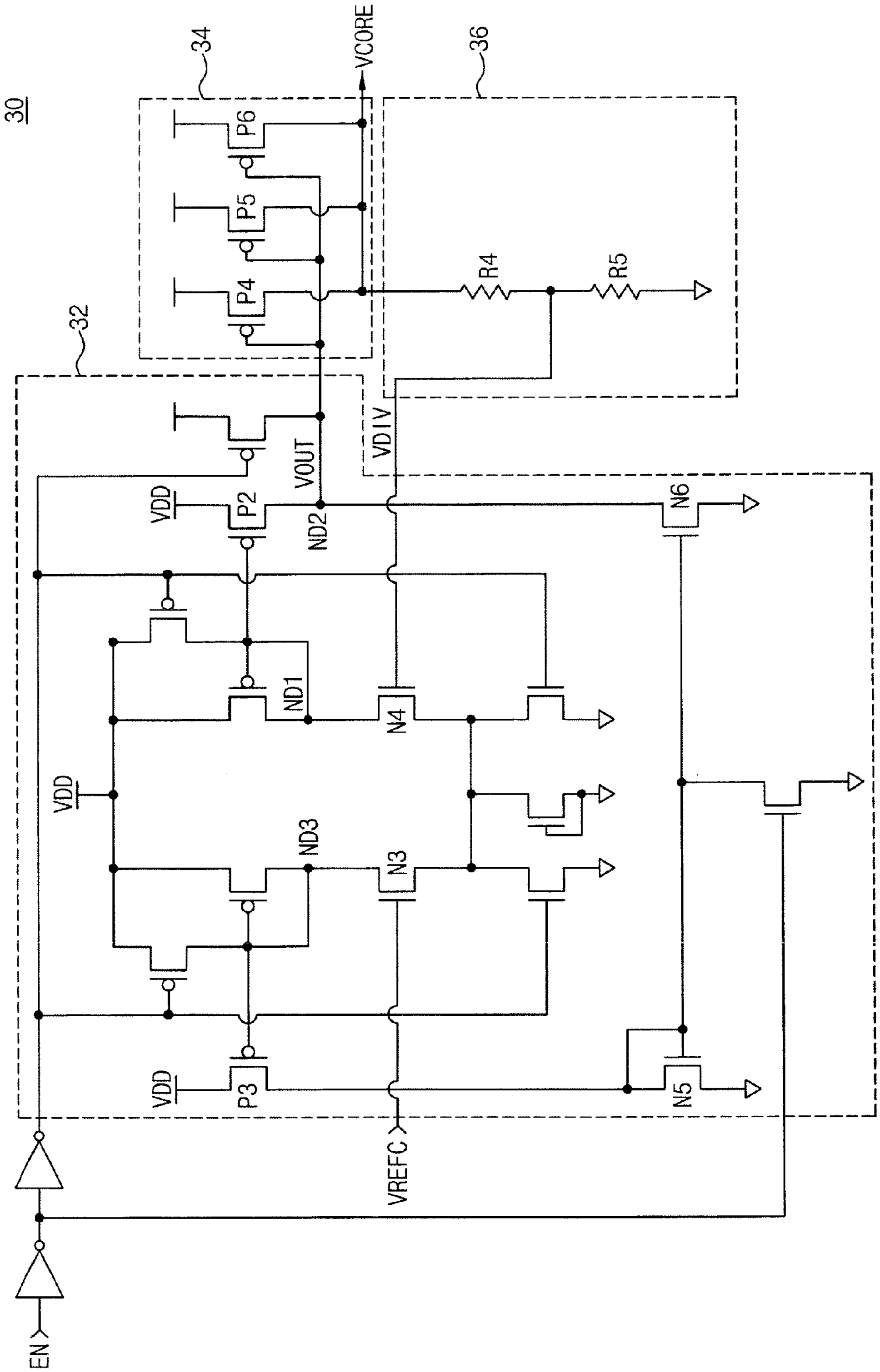
FIG. 6 is a detailed circuit view of the internal voltage generation unit of FIG. 2.

FIG. 6 is a detailed circuit view of the internal voltage generation unit 30 of FIG. 2. Referring to FIG. 6, the internal voltage generation unit 30 includes a voltage detection unit 32, a driver unit 34, and a voltage distribution unit 36.

Figure 1:
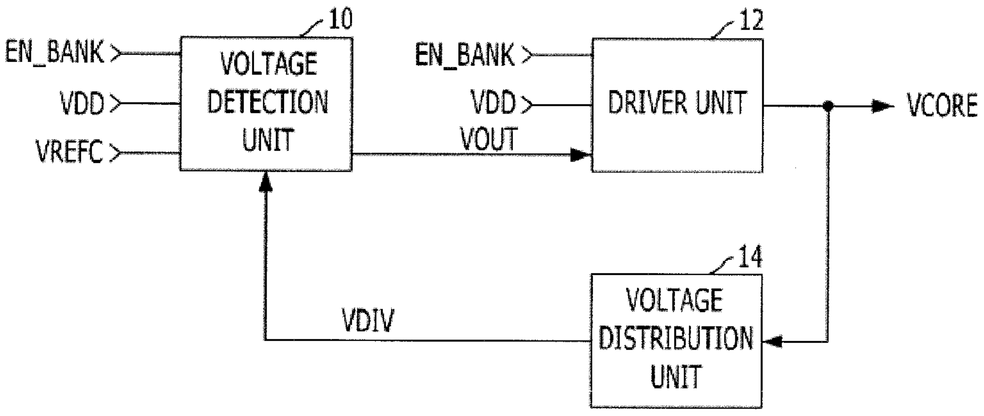
FIG. 1 (PRIOR ART)
FIG. 1 is a block diagram of a conventional internal voltage generation circuit of a prior art.

The conventional internal voltage generation circuit (FIG. 1) is controlled by a bank enable signal EN_BANK. In the present invention, the internal voltage generation circuit 30 is controlled by an internal voltage enable signal EN1 whose pulse width varies in response to the level of the external voltage VDD, making it possible to improve current consumption and supply a stable internal voltage.

The voltage detection unit 32 includes a differential amplifier having a mirror structure. The voltage detection unit 32 compares a reference voltage VREFC applied to a gate of an NMOS transistor N3 with a distribution voltage VDIV applied to a gate of an NMOS transistor N4 to output a control voltage VOUT.

More specifically, when the distribution voltage VDIV is higher than the reference voltage VREFC, the NMOS transistor N4 is strongly turned on to lower the potential of node ND1 so that PMOS transistor P2 is turned on to output the external voltage VDD to node ND2 (that is, the control voltage VOUT).

When the distribution voltage VDIV is lower than the reference voltage VREFC, the NMOS transistor N4 is weakly turned on to lower the potential of node ND3 so that PMOS transistor P3 is turned on and NMOS transistors N5, N6 are continuously turned on to output the ground voltage VSS to the node ND2 (that is, the control voltage VOUT).

The driver unit 34 includes PMOS transistors P4 to P6, which are each controlled by the control voltage VOUT. The driver unit 34 constantly maintains the internal voltage VCORE by selectively supplying the external voltage VDD according to the control voltage VOUT.

The voltage distribution unit 36 includes resistors R4, R5 connected in series between an output terminal of the driver unit 34 and a power supply unit supplying the ground voltage VSS. The voltage distribution unit 36 distributes the internal voltage VCORE using the resistors R4, R5 to output the distribution voltage VDIV.

In other words, the internal voltage generation unit 30 generates the internal voltage VCORE according to an internal voltage enable signal EN whose enable pulse width D1 or D2 varies in accordance with the level of the external voltage VDD, making it possible to improve current consumption at the high voltage HIGH_VDD and to increase current drivability at the low voltage LOW_VDD.

Additionally, the enable pulse width D1 or D2 of the internal voltage enable signal EN is shorter than the enable pulse width D of the bank enable signal EN_BANK, making it possible to reduce the amount of internal voltage generation circuitry included in a chip, and to improve current consumption required for a low power product, etc.

Figure 7:
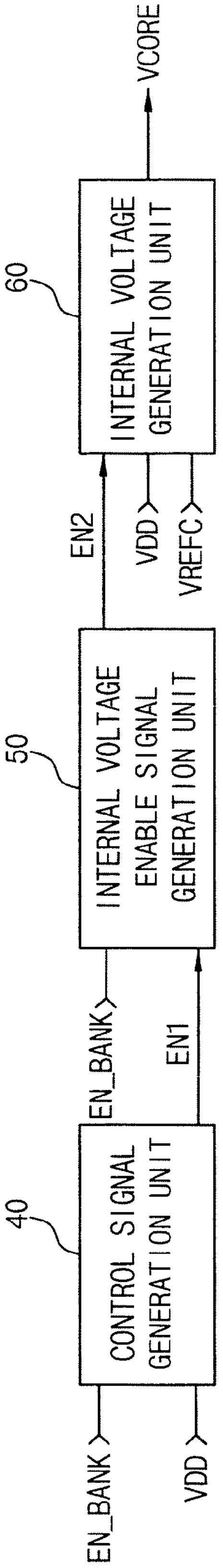
FIG. 7 is a block diagram of an internal voltage generation circuit according to a second embodiment of the present invention.

FIG. 7 is a block diagram of an internal voltage generation circuit according to a second embodiment of the present invention. Referring to FIG. 7, an internal voltage generation circuit 3 according to a second embodiment of the present invention includes a control signal generation unit 40 that generates a control signal EN1 variably controlling the pulse width of a bank enable signal EN_BANK in response to the external voltage VDD. The internal voltage generation circuit 3 also includes an internal voltage enable signal generation unit 50 that generates an internal voltage enable signal EN2 synchronized with the bank enable signal EN_BANK and having a pulse width controlled by the control signal EN1. The internal voltage generation circuit also includes an internal voltage generation unit 60 generates an internal voltage corresponding to a reference voltage VREFC generated according to the internal voltage enable signal EN2.

In other words, the control signal generation unit 40 generates the control signal EN1 whose enable pulse width at a high voltage HIGH_VDD is shorter than its enable pulse width at a low voltage LOW_VDD. The internal voltage enable signal generation unit 50 generates the internal voltage enable signal EN2 having a longer pulse width than the enable pulse width of the bank enable signal EN_BANK in order to improve current drivability.

Figure 8:
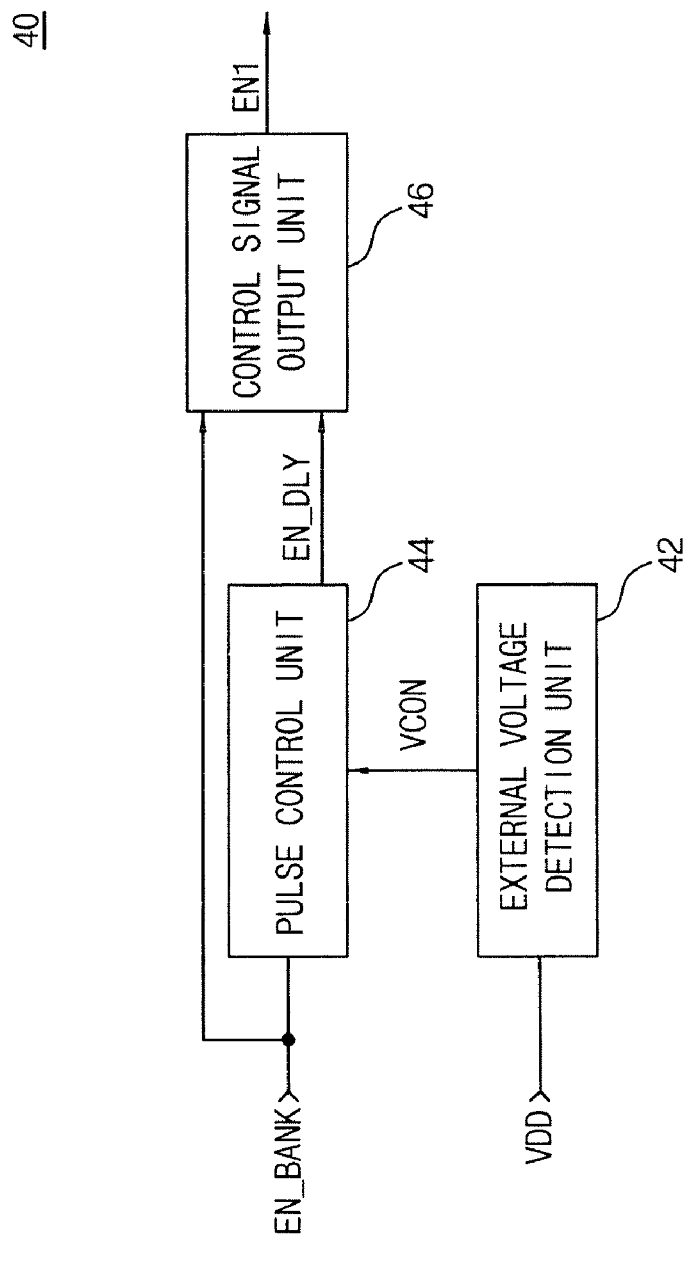
FIG. 8 is a block diagram of the control signal generation unit of FIG. 7.

FIG. 8 is a block diagram of the control signal generation unit of FIG. 7. Referring to FIG. 8, a control signal generation unit 40 includes an external voltage detection unit 42, a pulse control unit 44, and a control signal output unit 46. These may correspond to the external voltage detection unit 22, the pulse control unit 24, and the enable signal generation unit 26 of the internal voltage enable signal generation unit (FIG. 3) of the first embodiment, respectively, and they are the same in view of the constitution and operation.

In other words, the external voltage detection unit 42 supplies a variable detection voltage VCON corresponding to a level of the external voltage VDD; the pulse control unit 44 variably delays a pulse width of a bank enable signal EN_BANK according to a level of the detection voltage VCON; and the control signal generation unit 46 outputs a control signal EN1 in response to a combination of the bank enable signal EN_BANK and a delay signal EN_DLY that is output from a delay control unit 44.

Figure 9:
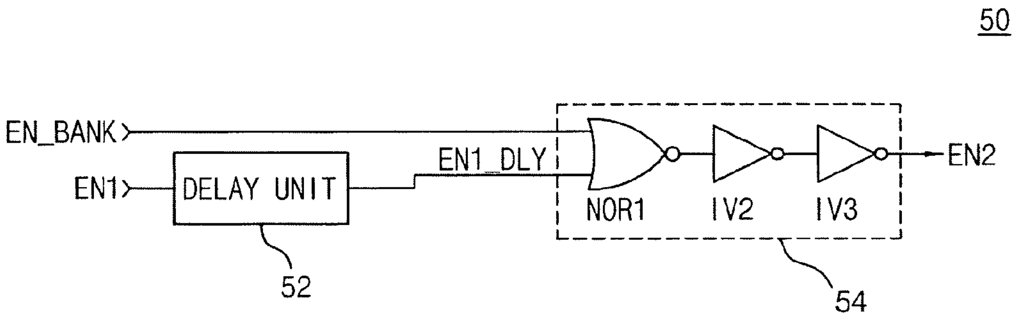
FIG. 9 is a detailed circuit view of the internal voltage enable signal generation unit of FIG. 7.

FIG. 9 is a detailed circuit view of the internal voltage enable signal generation unit 50 of FIG. 7. Referring to FIG. 9, an internal voltage enable signal generation unit includes a delay unit 52 which delays a control signal EN1; and an enable signal generation unit 54 which generates an internal voltage enable signal EN2 by combining the bank enable signal EN_BANK and a signal EN1_DLY output from the delay unit 52.

The delay unit 52 may include an inverter, etc. that delays and outputs an input signal, wherein a delay width D3 of the input signal is preferably shorter than an enable pulse width D of the bank enable signal EN_BANK.

The enable signal generation unit 54 may include a NOR gate NOR2 and inverters IV2, IV3. The enable signal generation unit 54 outputs the internal voltage enable signal EN2 having a longer pulse width than the enable pulse width D of the bank enable signal EN_BANK by logically combining the bank enable signal EN_BANK and the signal EN1_DLY output from the delay unit 52.

Figure 10A:
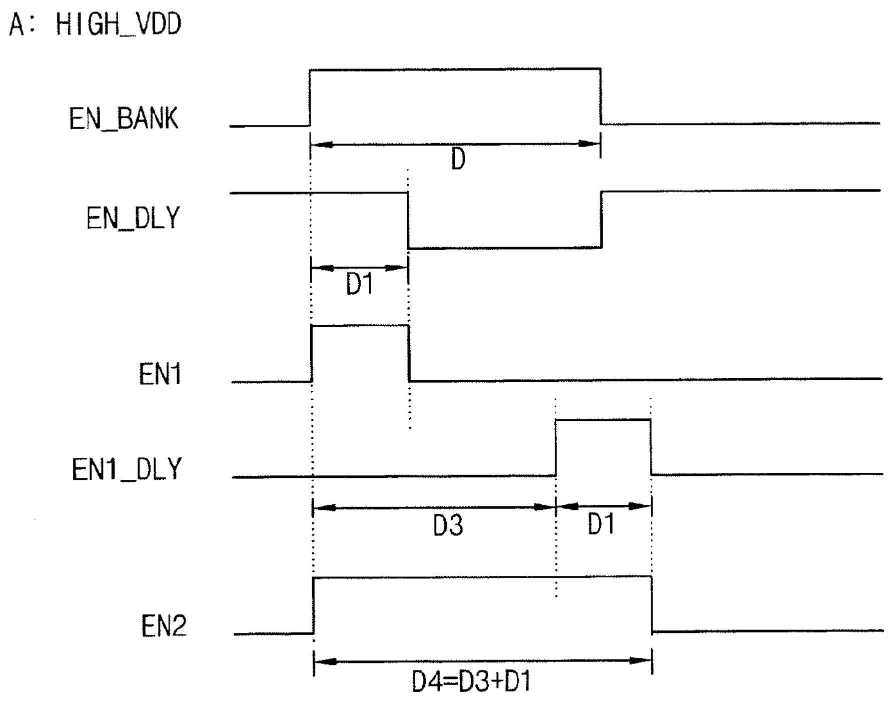
FIGS. 10A and 10B are waveform views of an internal voltage enable signal generated in an internal voltage generation circuit according to a second embodiment of the present invention.
Figure 10B:
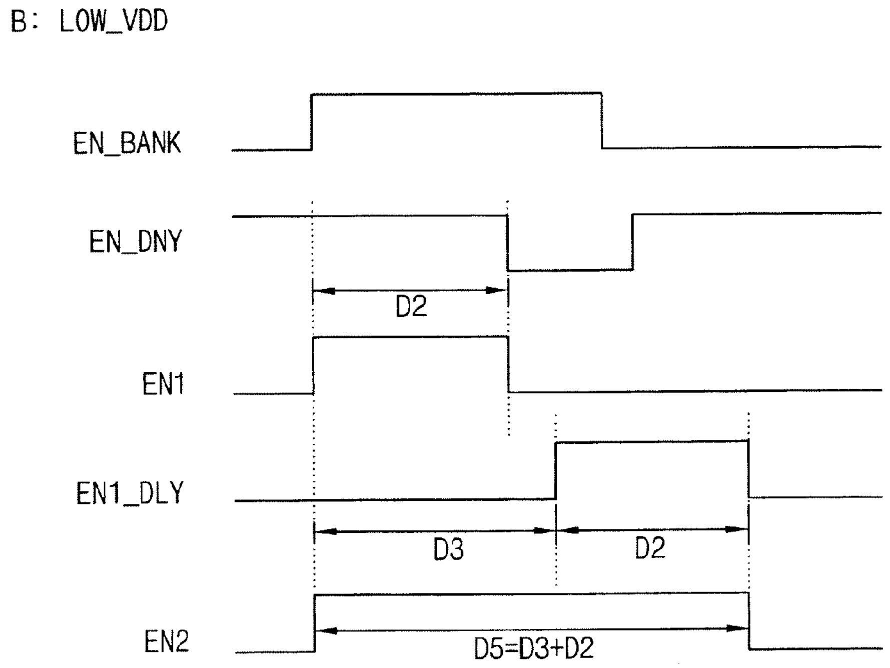

FIGS. 10A and 10B are waveform views of the internal enable signal generated in the internal voltage generation circuit. Operations of a control signal generation unit 40 and the internal voltage enable signal generation unit 50 when the external voltage VDD is a high voltage HIGH_VDD will be described with reference to FIG. 10*a*.

When reviewing the operation of the control signal generation unit 40, the external voltage detection unit 42 outputs a high detection voltage VCON. The pulse control unit 44 provides a short delay D1 of the pulse width D of the bank enable signal EN_BANK in response to the high detection voltage VCON to output the delayed bank enable signal EN_BANK as a delay signal EN_DLY. A control signal generation unit 66 outputs the control signal EN1 having an enable pulse width corresponding to the delay D1.

When reviewing the operation of the internal voltage enable signal generation unit 50, the delay unit 52 delays D3 the control signal EN1 to output the delay signal EN1_DLY. The enable signal generation unit 54 outputs an internal voltage enable signal EN2 having an enable pulse width corresponding to a delay D4=D3+D1.

The operation of the control signal generation unit 40 and the internal voltage enable signal generation unit 50 when the external voltage VDD is a low voltage LOW_VDD will be described with reference to FIG. 10*b*.

When reviewing the control signal generation unit 40, the external voltage detection unit 42 outputs a low detection voltage VCON. The pulse control unit 44 provides a lengthy delay D2 of the pulse width D of the bank enable signal EN_BANK in response to the low detection voltage VCON to output the delayed bank enable signal EN_BANK as the delay signal EN_DLY. The control signal generation unit 66 outputs the control signal EN1 having an enable pulse width corresponding to the delay D2.

When reviewing the operation of the internal voltage enable signal generation unit 50, the delay unit 52 delays D3 a control signal EN1 to output the delay signal EN1_DLY. The enable signal generation unit 54 outputs the internal voltage enable signal EN2 having an enable pulse width corresponding to a delay D5=D3+D2.

In other words, the control signal generation unit 40 outputs the control signal EN1 having a shorter pulse width than the pulse width D of the enable signal EN_BANK, and the enable pulse width D1 at high voltage HIGH_VDD is shorter than the enable pulse width D2 at low voltage LOW_VDD.

Additionally, the internal voltage enable signal generation unit 50 outputs the internal voltage enable signal EN2 having a longer enable pulse width D4 or D5 than the enable pulse width D of the bank enable signal EN_BANK by combining the bank enable signal EN_BANK and the control signal EN1.

The internal voltage generation unit 60 is constituted in the same manner as the internal voltage generation unit (FIG. 6) according to the first embodiment, and the internal voltage generation unit 60 is controlled by the internal voltage enable signal EN2 to generate the internal voltage.

In other words, the internal voltage generation unit 60 is driven by the internal voltage enable signal EN2 having a longer enable pulse width D4 or D5 than the enable pulse width D of the bank enable signal EN_BANK, making it possible to improve current drivability when an internal voltage generation circuit is short within a chip.

Additionally, the internal voltage generation unit 50 is driven by the internal voltage enable signal EN2 having a short enable pulse width D4 at high voltage HIGH_VDD, making it possible to improve current consumption. The internal voltage generation unit 50 is driven by the internal voltage enable signal EN2 having a long enable pulse width D5 at low voltage LOW_VDD, making it possible to improve current drivability.

As described above, the internal voltage generation circuit of the present invention controls an enable pulse width of an internal voltage enable signal corresponding to an external voltage, and generates internal voltage according to the internal voltage enable signal; thereby making it possible to improve current consumption at high voltage and to improve current drivability at low voltage.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An internal voltage generation circuit receiving an external voltage and a bank enable signal, the internal voltage generation circuit comprising:

an internal voltage enable signal generation unit generating an internal voltage enable signal, wherein an enable pulse width of the internal voltage enable signal is controlled based on a level of the external voltage; and an internal voltage generation unit generating an internal voltage corresponding to a reference voltage, wherein the internal voltage is generated during the enable pulse width of the internal voltage enable signal.

2. The internal voltage generation circuit as set forth in claim 1, wherein the internal voltage enable signal generation unit comprises:

an external voltage detection unit supplying a detection voltage, wherein a level of the detection voltage varies according to the level of the external voltage;

a pulse control unit variably delaying a pulse width of the bank enable signal according to the level of the detection voltage to output a delay signal; and an enable signal generation unit generating the internal voltage enable signal such that the internal voltage enable signal is synchronized with the bank enable signal, wherein the internal voltage enable signal has a pulse width controlled by the delay signal.

3. The internal voltage generation circuit as set forth in claim 2, wherein the external voltage detection unit comprises a first resistor and a second resistor connected in series between a power supply terminal supplying the external voltage and a power supply terminal supplying a ground voltage, wherein a common node voltage of the first resistor and the second resistor is output as the detection voltage.

4. The internal voltage generation circuit as set forth in claim 2, wherein the internal voltage enable signal generation unit comprises:

a plurality of serially connected pulse control units, the number of pulse control units being odd, wherein the plurality of serially connected pulse control units sequentially delays the bank enable signal and outputs the delay signal.

5. The internal voltage generation circuit as set forth in claim 2, wherein the pulse control unit comprises:

a driver which is driven by the bank enable signal; and a controller which controls a driving speed of the driver according to the level of the detection voltage.

6. The internal voltage generation circuit as set forth in claim 5, wherein the driver comprises a PMOS transistor and an NMOS transistor connected in series between the power supply terminal supplying the external voltage and the controller, wherein the bank enable signal is supplied to a common gate of the PMOS transistor and the NMOS transistor, and an output of the driver is the common drain of the PMOS transistor and the NMOS transistor.

7. The internal voltage generation circuit as set forth in claim 5, wherein the controller comprises:

an NMOS transistor having a drain connected to the driver and a gate receiving the detection voltage, wherein the driving speed is controlled by the detection voltage; and a resistor connected between a source of the NMOS transistor and the power supply terminal supplying the ground voltage.

8. The internal voltage generation circuit as set forth in claim 5, wherein the pulse control unit further comprises a delay unit delaying an output of the driver.

9. The internal voltage generation circuit as set forth in claim 8, wherein the delay device comprises:

a PMOS transistor having a source and a drain connected to the power supply terminal supplying the external voltage and a gate connected to the output of the driver; and an NMOS transistor having a source and a drain connected to the power supply terminal supplying the ground voltage and a gate connected to the output of the driver.

10. The internal voltage generation circuit as set forth in claim 2, wherein the enable signal generation unit comprises:

a NAND gate receiving the bank enable signal and the delay signal output from the pulse control unit; and an inverter which inverts an output of the NAND gate and outputs the internal voltage enable signal.

11. An internal voltage generation circuit receiving an external voltage and a bank enable signal, the internal voltage generation circuit comprising:

a control signal generation unit generating a control signal, wherein an enable pulse width of the control signal is controlled based on a level of the external voltage;

an internal voltage enable signal generation unit generating an internal voltage enable signal synchronized with the bank enable signal, wherein an enable pulse width of the internal voltage enable signal is controlled based on the control signal; and an internal voltage generation unit generating an internal voltage corresponding to a reference voltage, wherein the internal voltage is generated during the enable pulse width of the internal voltage enable signal.

12. The internal voltage generation circuit as set forth in claim 11, wherein the control signal generation unit comprises:

an external voltage detection unit which supplying a detection voltage, wherein a level of the detection voltage varies according to the level of the external voltage;

a pulse control unit variably delaying a pulse width of the bank enable signal according to the level of the detection voltage to output a delay signal; and a control signal output unit outputting the control signal synchronized with the bank enable signal, wherein the pulse width of the control signal is controlled by the delay signal output from the pulse control unit.

13. The internal voltage generation circuit as set forth in claim 12, wherein the external voltage detection unit comprises a first resistor and a second resistor connected in series between a power supply terminal supplying the external voltage and a power supply terminal supplying a ground voltage, wherein a common node voltage of the first resistor and the second resistor is output as the detection voltage.

14. The internal voltage generation circuit as set forth in claim 12, wherein the control signal generation unit comprises:

a plurality of serially connected pulse control units, the number of pulse control units being odd, wherein the plurality of serially connected pulse control units sequentially delay the bank enable signal and outputs the delay signal.

15. The internal voltage generation circuit as set forth in claim 12, wherein the pulse control unit comprises:

a driver which is driven by the bank enable signal;

and a controller which controls a driving speed of the driver according to the level of the detection voltage.

16. The internal voltage generation circuit as set forth in claim 15, wherein the driver comprises: a PMOS transistor and an NMOS transistor connected in series between the power supply terminal supplying the external voltage and the controller, wherein the bank enable signal is supplied to a common gate of the PMOS transistor and the NMOS transistor, and an output of the driver is the common drain of the PMOS transistor and the NMOS transistor.

17. The internal voltage generation circuit as set forth in claim 15, wherein the controller comprises:

an NMOS transistor having a drain connected to the driver and a gate receiving the detection voltage, wherein the driving speed is controlled by the detection voltage; and a resistor connected between a source of the NMOS transistor and the power supply terminal supplying the ground voltage.

18. The internal voltage generation circuit as set forth in claim 15, wherein the pulse control unit further comprises a delay device delaying an output of the driver.

19. The internal voltage generation circuit as set forth in claim 18, wherein the delay device comprises:

a PMOS transistor having a source and a drain connected to the power supply terminal supplying the external voltage and a gate connected to the output of the driver; and an NMOS transistor having a source and a drain connected to the power supply terminal supplying the ground voltage and a gate connected to the output of the driver.

20. The internal voltage generation circuit as set forth in claim 12, wherein the control signal output unit comprises:

a NAND gate receiving the bank enable signal and the delay signal output from the pulse control unit; and an inverter which inverts an output of the NAND gate and outputs the control signal.

21. The internal voltage generation circuit as set forth in claim 11, wherein the internal voltage enable signal generation unit comprises:

a delay unit delaying the control signal to output a second delay signal;

an enable signal generation unit generating the internal voltage enable signal by combining the bank enable signal and the second delay signal.

22. The internal voltage generation circuit as set forth in claim 21, wherein the delay unit delays the control signal to be shorter than the enable pulse width of the bank enable signal to output it.

23. The internal voltage generation circuit as set forth in claim 21, wherein the enable signal generation unit comprises:

a NOR gate receiving the bank enable signal and the second delay signal; and inverters driving an output of the NOR gate to output the internal voltage enable signal.

* * * * *